United States Patent
Zhang

(10) Patent No.: US 6,862,225 B2
(45) Date of Patent: Mar. 1, 2005

(54) BUFFER FOR A SPLIT CACHE LINE ACCESS

(75) Inventor: Kevin X. Zhang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/897,869

(22) Filed: Jul. 23, 2004

(65) Prior Publication Data

US 2004/0260878 A1 Dec. 23, 2004

Related U.S. Application Data

(62) Division of application No. 09/642,035, filed on Aug. 18, 2000, now Pat. No. 6,778,444.

(51) Int. Cl.[7] .................................................. G11C 7/00
(52) U.S. Cl. ..................... 365/189.05; 365/49; 365/233
(58) Field of Search ............................ 365/49, 189.05, 365/233, 230.08; 711/118, 167

(56) References Cited

U.S. PATENT DOCUMENTS

| | | | | |
|---|---|---|---|---|
| 4,853,846 A | * | 8/1989 | Johnson et al. | 710/300 |
| 5,023,776 A | | 6/1991 | Gregor | 711/122 |
| 5,113,510 A | * | 5/1992 | Hillis | 711/121 |
| 5,228,135 A | | 7/1993 | Ikumi | 395/425 |
| 5,247,649 A | | 9/1993 | Bandoh | 395/425 |
| 5,299,147 A | | 3/1994 | Holst | 365/49 |
| 5,414,824 A | | 5/1995 | Grochowski | 395/400 |
| 5,426,783 A | | 6/1995 | Norrie et al. | 712/225 |
| 5,502,683 A | * | 3/1996 | Marchioro | 365/230.05 |
| 5,706,491 A | | 1/1998 | McMahan | 712/234 |
| 6,760,833 B1 | * | 7/2004 | Dowling | 712/34 |

* cited by examiner

Primary Examiner—Vu A. Le
(74) Attorney, Agent, or Firm—Schwegman, Lundberg, Woessner & Kluth, P.A.

(57) ABSTRACT

A novel buffer design including a differential driver circuit provides an improved overall performance to a microprocessor by reducing the number of cycles required by the microprocessor to access data from a cache memory during a split cache line access. In one embodiment of the present invention, when a request to access data from a cache memory comes from a microprocessor, during a first cycle, a first sense amplifier coupled to the cache memory senses a first cache line from the cache memory. Then a first input driver circuit coupled to the first sense amplifier receives the sensed first cache line and stores the first cache line in a split buffer. Then the first sense amplifier senses a second cache line from the cache memory. Then a second sense amplifier coupled to the split buffer senses the stored first cache line from the split buffer. During a second cycle, a control logic circuit coupled to the first and second sense amplifiers, compares the sensed first cache line and the second cache line and sends a command signal to the first and second input driver circuits to substantially simultaneously output the first and second cache lines to a cache output bus circuit.

17 Claims, 4 Drawing Sheets

US 6,862,225 B2

BUFFER FOR A SPLIT CACHE LINE ACCESS

This application is a divisional of U.S. patent application Ser. No. 09/642,035, filed on Aug. 18, 2000, now U.S. Pat. No. 6,778,444 which is incorporated herein by reference.

TECHNICAL FIELD

This invention relates generally to cache memories in a microprocessor, and more particularly, to improving performance of on-chip cache memories during a split cache line access.

BACKGROUND

In computer architectures using mass storage devices, such as disk drives, time delays in memory access are imposed by considerations such as disk revolution speeds. It has been a challenge for system designers to find ways to reduce these access delays. A commonly used technique has been to provide one or more regions of high speed random access memories, called cache memory. Portions of the contents of the mass storage are copied into the cache memory as required by the processor, modified, and written back to the mass storage. Cache memories continue to be one of the most pervasive structures found in microprocessors. Effective use of a cache memory can result in substantial performance improvements in microprocessors, which is why many microprocessors now include one or more cache memories in their architecture.

Cache memories are generally organized in "lines", and they can include hundreds of cache lines. Each line can include a selected block of memory, which may be many bytes in length. In a cache load access, a split cache line access can occur when a data or instruction access crosses over a cache line boundary, which means that part of the desired data resides in one cache line, and the remainder of the desired data resides in another cache line. The existing techniques generally require three or more cycles to complete a split cache line access. In a first cycle, the first part of the data is fetched from the first cache line and stored into an intermediate buffer, often called a split-buffer. In a second cycle, the rest of the data from the other cache line is fetched and also stored in the split buffer. In a third cycle, the split-buffer is accessed to fetch the complete data. Thus, the existing techniques generally require at least three cycles of operations by a microprocessor to complete a split cache line access. The number of cycles required to complete a split cache line access can have a significant impact on the performance of the microprocessor. In order to achieve a higher performance from the microprocessor, it is necessary to reduce the time required to access data during a split cache line access.

Therefore there is a need to reduce the number of cycles required by the microprocessor during the split cache line access to improve the overall performance of the microprocessor.

DETAILED DESCRIPTION

Figure 1:
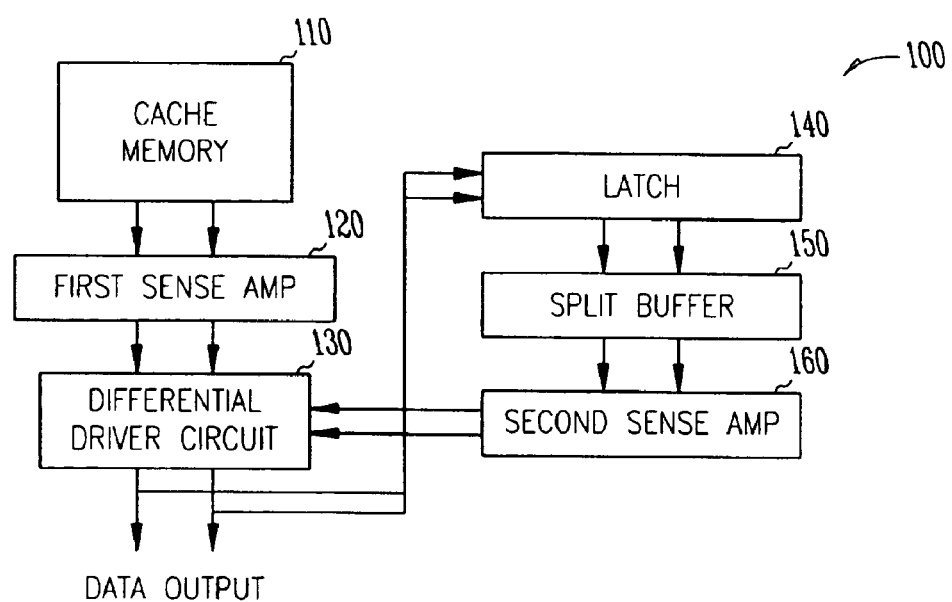
FIG. 1 shows a block diagram of one embodiment of a novel buffer design formed according to the teachings of the present invention.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The present invention provides an improved method and apparatus for accessing data stored in a first cache line that continues into a second cache line of a cache memory. This is accomplished in this embodiment, by using a novel buffer design including a differential driver circuit to reduce the number of cycles required to access data during such a split cache line access.

FIG. 1 is a block diagram, illustrating one embodiment of a novel buffer design including a differential driver circuit 100 according to the present invention. Shown in FIG. 1 are some major components of the novel buffer design and their interconnections. FIG. 1 shows a cache memory 110 and a first sense amplifier 120 communicatively coupled to a differential driver circuit 130. Also shown in FIG. 1 are a latch 140, a split buffer 150 and a second sense amplifier 160 communicatively coupled to the differential driver circuit 130.

According to the teachings of the embodiment shown in FIG. 1, in a split cache line access to the cache memory 110, during a first cycle, a first part of the data is fetched from a first cache line in the cache memory 110 through the first sense amplifier 120. Then the retrieved first part of the data is latched using the latch 140. Then the latched data is stored in the split buffer 150. During a second cycle, remaining part of the data is fetched from a second cache line in the cache memory 110, and at the same time, the split buffer 150 is accessed by the differential driver circuit 130 through the second sense amplifier 160. In some embodiments, the second cache line can be adjacent to the first cache line. Then the differential driver circuit 130 selectively fires the first and second sense amplifiers 120 and 160 to combine the fetched data from the first cache line and the second, adjacent cache line, and outputs the combined data to a cache output bus circuit. Thus, the above described process eliminates the need for the third cycle required by the prior art to complete the split cache line access. Also the selective firing of the first and second sense amplifiers 120 and 160, reduces the power consumption by the microprocessor by firing only the sense amplifier(s) requiring to output the data to the cache output bus circuit.

Figure 2:
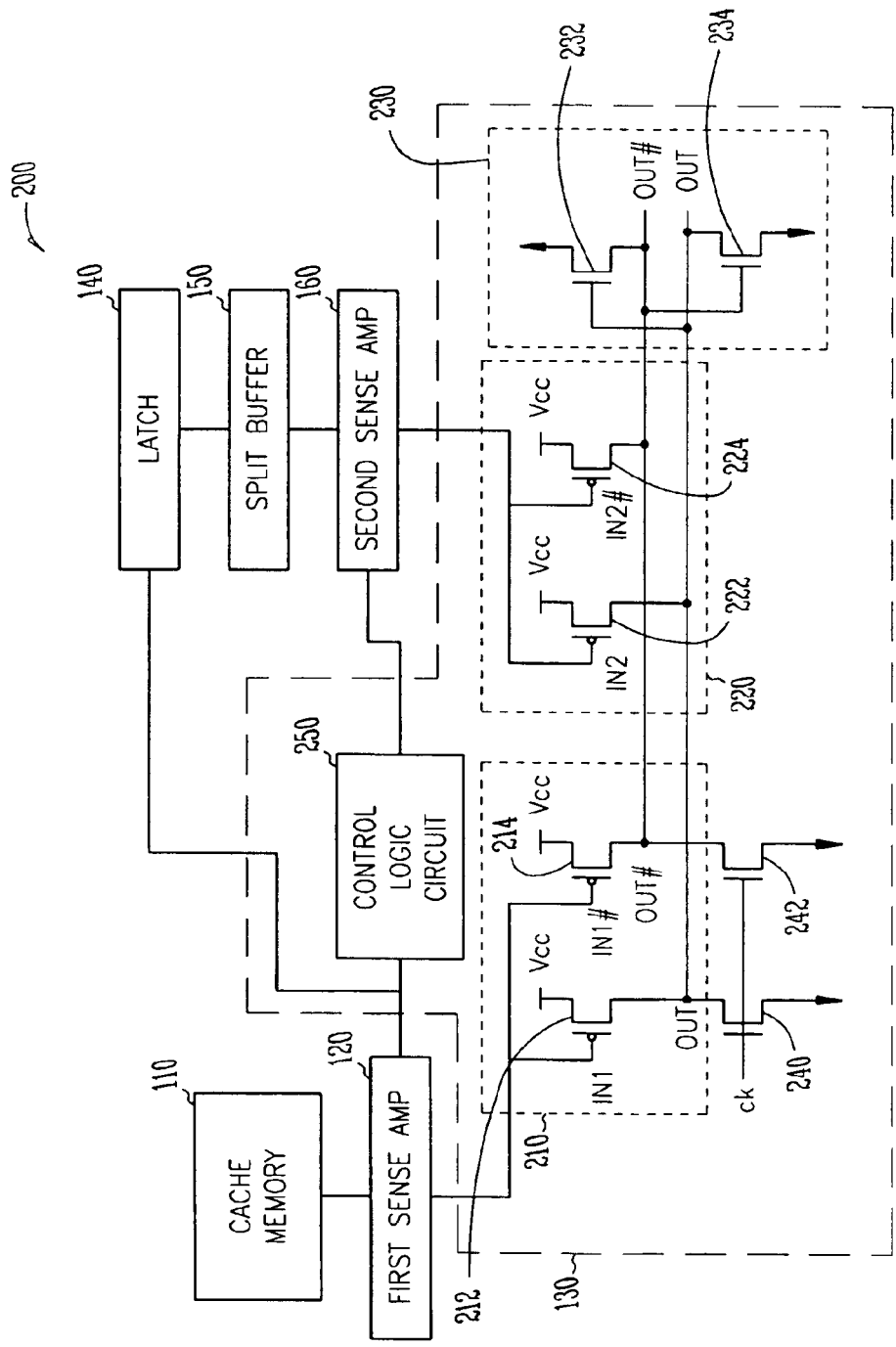
FIG. 2 shows a schematic diagram of one embodiment of the present invention.

FIG. 2 is a schematic diagram of one embodiment of the differential driver circuit 130 including block diagrams of some major components of the novel buffer design 100. The differential driver circuit 130 shown in FIG. 2 includes first and second input driver circuits 210 and 220, a control logic circuit 250, a cache output bus circuit 230, and a pair of clock transistors 240 and 242. Further, the FIG. 2 shows the differential driver circuit 130 coupled to the cache memory 110, the first and second sense amplifiers 120 and 160, the latch 140, and the split buffer 150.

Description of the Connectivity of the Differential Driver Circuit:

The first input drive circuit 210 of the differential driver circuit 130 includes a first pair of PMOS transistors 212 and 214 coupled between a first current source node ($V_{CC}$) and respective output terminals (OUT) and (OUT#). Source of each of the first pair of PMOS transistors 212 and 214 is coupled to the $V_{CC}$. Gates of the first pair of PMOS transistors 212 and 214 are coupled to the first sense amplifier 120 to receive a command signal from the first sense amplifier 120, and drains of the first pair of PMOS transistors 212 and 214 are coupled to the OUT and OUT# terminals, respectively. The first pair of PMOS transistors 212 and 214 receive complementary input signals In1 and In1# from the first sense amplifier 120 and outputs complementary signals to the OUT and OUT# terminals, respectively.

The second input driver circuit 220 of the differential driver circuit 130 includes a second pair of PMOS transistors 222 and 224 coupled between $V_{CC}$ and the OUT and OUT# terminals. Source of each of the second pair of PMOS transistors 222 and 224 is coupled to the $V_{CC}$, gates of the second pair of PMOS transistors 222 and 224 are coupled to the second sense amplifier 160 to receive a command signal from the second sense amplifier 160, and drains of the second pair of PMOS transistors 222 and 224 are coupled to the OUT and OUT# terminals, respectively. The second pair of PMOS transistors 222 and 224 receive complementary input signals In2 and In2# from the second sense amplifier 160, and output complementary signals to the OUT and OUT# terminals, respectively.

The cache output bus circuit 230 of the differential driver circuit 130 includes a first NMOS transistor 232 coupled between ground and the drains of the first and second pair PMOS transistors 212, 214 and 222, 224. The source of the first NMOS transistor 232 is coupled to the ground, gate of the first NMOS transistor 232 is coupled to OUT terminal and thus to the drains of the PMOS transistors 212 and 222, and the drain of the first NMOS transistor 232 is coupled to OUT# terminal and thus to the drains of the PMOS transistors 214 and 224. The cache output bus circuit 230 further includes a second NMOS transistor 234 coupled between ground and drains of PMOS transistors 212, 214 and 222, 224, in which the source of the second NMOS transistor 234 is coupled to ground, gate of the second NMOS transistor 234 is coupled the OUT# terminal and to the drains of the PMOS transistors 214 and 224, and the drain of the second NMOS transistor 234 is coupled to the OUT terminal and to the drains of the PMOS transistors 212 and 222.

The differential driver circuit 130 also includes a pair of clock transistors 240 and 242 that are coupled between ground and respectively to the terminals of OUT and OUT#. The sources of the pair of clock transistors 240 and 242 are coupled to ground, their gates are coupled to a clock signal Clk, and their drains are coupled to OUT and OUT# terminals.

Also shown in FIG. 2 is the latch 140 coupled between the split buffer 150 and the first sense amplifier 120. Further, FIG. 2 shows a control logic circuit 250 of the differential driver circuit 130 coupled between the first and second sense amplifiers 120 and 160.

Description of the Operation of the Differential Driver Circuit:

In this example embodiment, the differential driver circuit 130, including the gates (In1, In1#, In2 and In2#) of the PMOS transistors 212, 214, 222 and 224 are precharged to a logic high when the clock signal Clk goes low. During this precharge phase, the cache output bus circuit 230 including nodes OUT and OUT# are at logic low. When the clock signal goes high (evaluation phase), depending on where the data is coming from (split buffer 150 or cache memory 110), the control logic circuit 250 turns on the appropriate first or second sense amplifiers 120 or 160. As a result, the inputs to the respective gates of PMOS transistors 212, 214, 222 and 224 go low. This will turn on the respective PMOS transistors 212, 214, 222 and 224 to drive the data to the output bus circuit 230 through OUT and OUT# terminals. Then the respective cross-coupled NMOS transistors 232 and 234 are turned on to reject noise and help maintain the integrity of the data.

Figure 3:
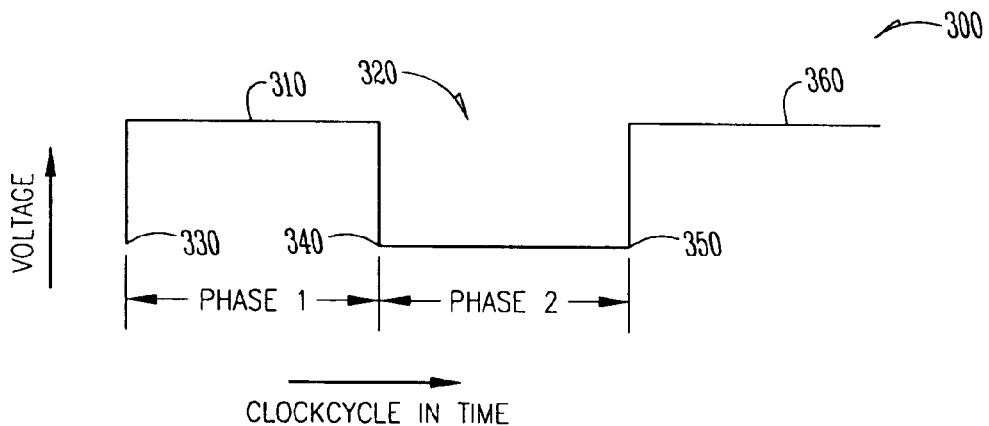
FIG. 3 is timing diagram of one embodiment of the present invention.

FIG. 3 is a timing diagram illustrating one embodiment of relative timing of various signals generated in a clock cycle 300 according to the teachings of the present invention. As shown in FIG. 3, during a rising edge 330 of a first phase 310 of the clock cycle 300, the first sense amplifier 120 is triggered by a global sensing signal from the control logic circuit 250 of the differential driver circuit 130 to retrieve data in the first cache line of the cache memory 110 and the retrieved data is stored in the split buffer 150. During a falling edge 340 of first phase 310, the stored data in the split buffer 150 is latched by the latch 140. During second phase 320, data in the first cache line is stored in the split buffer 150. During the rising edge 350 of first phase of a next cycle 360 and before the start of the next cycle 360, the first and second sense amplifiers 120 and 160 are selectively fired by the control logic circuit 250 to output a combined data including the data in first cache line and the data in second cache line. In one embodiment, during the raising edge 350 of the first phase of the next cycle, the first and second sense amplifiers 120 and 160 are fired substantially simultaneously to combine the data in the first and second, adjacent cache lines.

Figure 4:
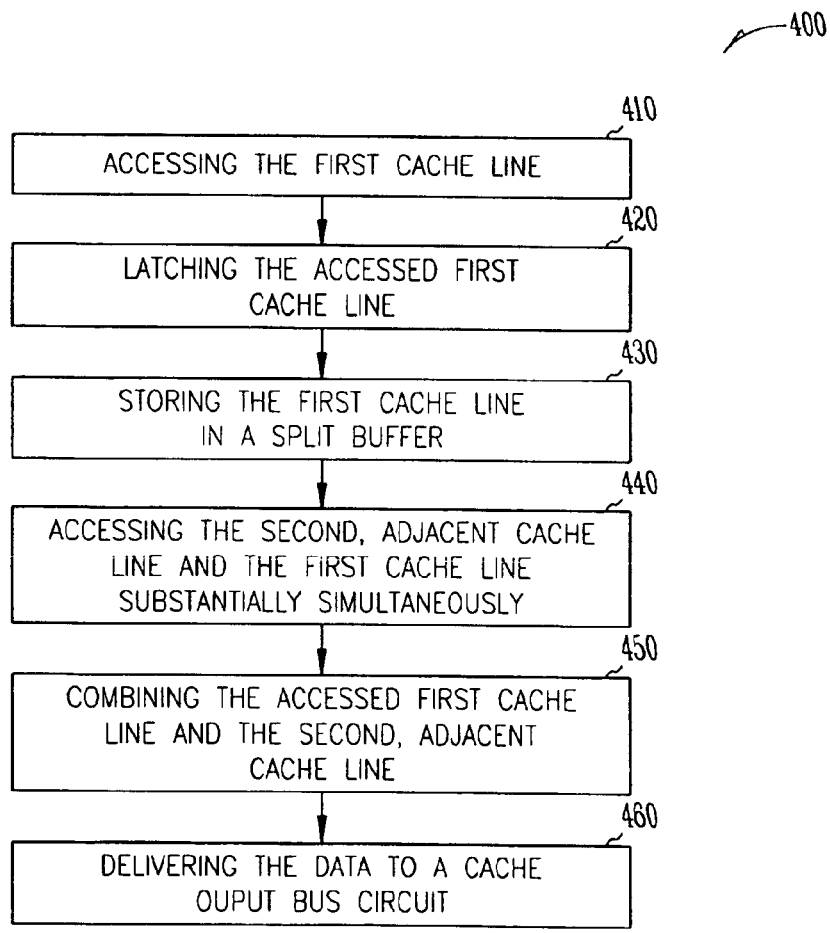
FIG. 4 is a flow diagram of a method which is realized by the buffers of FIGS. 1 and 2.

FIG. 4 shows a method 400 of performing a split cache line access according to the teachings of the present invention. Method 400 begins in action 410 by accessing data in a first cache line in the cache memory, when a request to access data in a split cache line of a cache memory comes from a microprocessor. In some embodiments, action 410 may include reading the first cache line from the cache memory, and sensing the read first cache line. Generally, the sensing operation includes amplifying the read data; because the read data from the cache memory is usually a very low level signal. The next action 420, includes latching the accessed data into a split buffer. Then the next action 430, includes storing the latched data in the split buffer. Action 440, can include accessing the second, adjacent cache line in the cache memory, and the first cache line in the split buffer substantially simultaneously. In some embodiments, action 440 can include reading the second cache line from the cache memory, sensing the read second cache line, and further sensing the stored first cache line in the split buffer. In some other embodiments, action 440 can include reading the second, adjacent cache line from the cache memory, sensing the read second, adjacent cache line, and further sensing the stored first cache line in the split buffer The next action 450, includes combining the accessed first and second cache lines to form the data requested by the microprocessor. In some embodiments, the action 450 can include selectively combining the accessed first and second cache lines based on an outcome of the sensing of the first and second cache lines by the first and second sense amplifiers. Then the next action 460, includes delivering the combined data to a cache output bus circuit. In some embodiments, the first and second cache lines can comprise at least 2 bytes of data.

Figure 5:
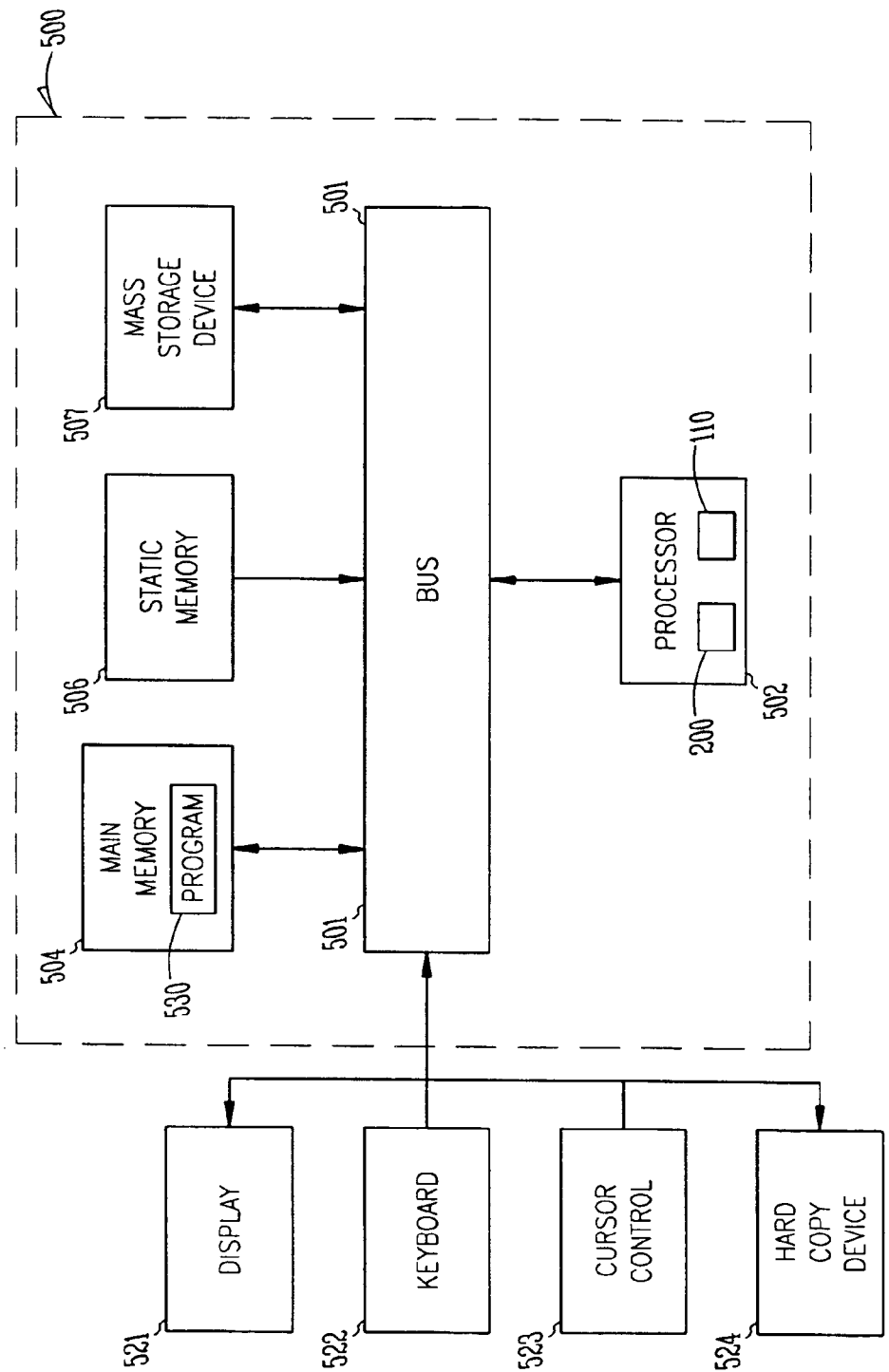
FIG. 5 is a block diagram of a typical hardware and operating environment in conjunction with which embodiments of the invention may be implemented.

FIG. 5 is a diagram of a typical hardware and operating environment in conjunction with which embodiments of the invention are implemented. Computer system 500 comprises a processor 502 including the input buffer circuit 200 and the cache memory 110 coupled with bus 501 for processing information. Computer system 500 further comprises a random access memory (RAM) or other dynamic storage device 504 (referred to as main memory), coupled to bus 501 for storing information and instructions to be executed by the processor 502. Main memory 504 may also be used for storing temporary variables or other intermediate information during execution of a split cache line access from the cache memory 110. Computer system 500 also comprises a read only memory (ROM) and/or other static storage device 506 coupled to the bus 501 for storing static information and instruction for processor 502, and a data storage device 507 such as a magnetic disk or optical disk and its corresponding disk drive. Data storage device 507 is coupled to bus 501 for storing information and instructions during execution of the split cache line access from the cache memory 110. Computer system 500 may further be coupled to a display device 521, such as a cathode ray tube (CRT) or liquid crystal display (LCD) coupled to bus 501 for displaying a layout model to a computer user. An alphanumeric input device 522, including alphanumeric and other keys, may also be coupled to bus 501 for communicating information and command selections to processor 502. An additional user input device may be cursor control device 523, such as a mouse, trackball, stylus, or cursor direction keys, may also be coupled to bus 501 for communicating information and command selections to processor 502, and for controlling cursor movement on display 521. Another device which may be coupled to bus 501 is hard copy device 524 which may be used for printing instructions, data, or other information on a medium such as paper, film, or similar types of media. Note, also, that any or all of the components of computer system 500 and associated hardware may be used in one embodiment, however, it can be appreciated that any type of configuration of the system may be used for various purposes as the user requires in other embodiments.

Computer-readable instructions stored on a computer-readable medium are executable by the processor 502 of the computer system 500. A hard drive, CD-ROM, and RAM are some examples of articles including a computer-readable medium. For example, a computer program 530 capable of executing the split cache line access from the cache memory 110 according to the teachings of the present invention may be included on a CD-ROM and loaded from the CD-ROM to a hard drive. The computer-readable instructions cause the computer system 500 to execute the split cache line access from the cache memory 110 according to the teachings of the present invention.

The above described method and apparatus provides, among other things, an improved overall performance of a microprocessor by reducing the number of cycles required by the microprocessor to access data from a cache memory during a split cache line access.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of accessing data stored in a first cache line that continues into a second cache line of a cache memory, comprising:

accessing the first cache line from the cache memory;

storing the first cache line in a split buffer; and accessing substantially simultaneously the first cache line from the split buffer, and the second cache line from the cache memory.

2. The method of claim 1, wherein the second cache line comprises a second, adjacent cache line.

3. The method of claim 1, which further comprises:

latching the accessed first cache line in the split buffer.

4. The method of claim 3, wherein accessing substantially simultaneously the first and second cache lines further comprises:

storing the second cache line in the split buffer and accessing substantially simultaneously the first and second cache lines from the split buffer.

5. The method of claim 4, wherein the actions of accessing the first cache line, storing the first cache line, and latching the accessed first cache line occurs during a first phase of a clock cycle.

6. The method of claim 1, which further comprises:

combining the substantially simultaneously accessed second cache line from the cache memory, and the first cache line from the split buffer to obtain the data; and delivering the data to a cache output bus circuit.

7. The method of claim 6, wherein accessing substantially simultaneously the second cache line from the cache memory, and the first cache line from the split buffer, combining, and delivering actions occur during a second phase of the clock cycle and before the start of a next subsequent clock cycle.

8. The method of claim 6, wherein the combining the accessed second cache line and the accessed first cache line further comprises:

sensing the accessed second cache line and the accessed first cache line; and selectively combining the first and second cache lines based on the outcome of the sensing.

9. The method of claim 8, wherein the sensing the accessed second cache line and the accessed first cache line further comprises:

sensing the accessed second cache line;

sensing the first cache line; and determining a sequence of combining the first and the second cache lines to obtain the data.

10. The method of claim 1, wherein the cache line comprises at least 2 bytes of data.

11. A method of performing a split cache line access from a cache memory of a microprocessor, comprising:

reading the first cache line from the cache memory during a first phase of a clock cycle;

sensing the read first cache line during the first phase of the clock cycle;

latching the sensed first cache line into a split buffer during the first phase of the clock cycle;

storing the latched first cache line in the split buffer during the first phase of the clock cycle;

reading the second cache line from the cache memory during the second phase of the clock cycle;

sensing the read second cache line during the second phase of the clock cycle;

sensing the stored first cache line from the split buffer during the second phase of the clock cycle; and substantially simultaneously delivering the sensed second cache line from the cache memory, and the sensed first cache line from the split buffer, respectively to a cache output bus circuit during the second phase of the clock cycle and before a start of a next subsequent clock cycle.

12. The method of claim 11, wherein sensing the read first cache line comprises amplifying the read first cache line to a digital logic level.

13. The method of claim 11, which further comprises:

combining the sensed first and second cache lines based on an outcome of sensing the first and second cache lines before delivering the sensed first and second cache lines to the cache output bus circuit.

14. The method of claim 11, wherein substantially simultaneously delivering the sensed second cache line from the cache memory and the sensed first cache line from the split buffer comprises selectively delivering the first and sensed cache lines.

15. A computer readable medium having computer executable instructions for performing a method, the method comprising:

reading the first cache line from the cache memory during a first phase of a clock cycle;

sensing the read first cache line during the first phase of the clock cycle;

latching the sensed first cache line into a split buffer during the first phase of the clock cycle;

storing the latched first cache line in the split buffer during the first phase of the clock cycle;

reading the second cache line from the cache memory during a second phase of the clock cycle;

sensing the read second cache line during the second phase of the clock cycle;

sensing the stored first cache line from the split buffer during the second phase of the clock cycle; and substantially simultaneously delivering the sensed second cache line from the cache memory, and the sensed first cache line from the split buffer, respectively to a cache output bus circuit before a start of a next first phase of a next clock cycle.

16. The computer-readable medium of claim 15, wherein the sensing the read first cache line comprises amplifying the read first cache line to a digital logic level.

17. The computer-readable medium of claim 15, which further comprises:

combining the sensed first and second cache lines based on an outcome of sensing the first and second cache lines before delivering the sensed first and second cache lines to the cache output bus circuit.

* * * * *